United States Patent
Baldwin et al.

(10) Patent No.: US 9,543,374 B2
(45) Date of Patent: Jan. 10, 2017

(54) LOW TEMPERATURE COEFFICIENT RESISTOR IN CMOS FLOW

(71) Applicant: Texas Instruments Incorporated, Dallas, TX (US)

(72) Inventors: Greg Charles Baldwin, Plano, TX (US); Kamel Benaissa, Garland, TX (US); Sarah Liu, Plano, TX (US); Song Zhao, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 79 days.

(21) Appl. No.: 14/569,975

(22) Filed: Dec. 15, 2014

(65) Prior Publication Data

US 2015/0171158 A1    Jun. 18, 2015

Related U.S. Application Data

(62) Division of application No. 13/288,700, filed on Nov. 3, 2011, now Pat. No. 8,940,598.

(60) Provisional application No. 61/409,579, filed on Nov. 3, 2010.

(51) Int. Cl.
```
G06F 17/50    (2006.01)
H01L 49/02    (2006.01)
H01L 27/06    (2006.01)
H01L 21/265   (2006.01)
H01L 21/8238  (2006.01)
H02J 7/02     (2016.01)
H02J 7/00     (2006.01)
```

(52) U.S. Cl.
CPC ............. *H01L 28/22* (2013.01); *H01L 21/265* (2013.01); *H01L 21/8238* (2013.01); *H01L 27/0629* (2013.01); *G06F 17/5072* (2013.01); *G06F 17/5081* (2013.01); *H02J 7/0044* (2013.01); *H02J 7/025* (2013.01)

(58) Field of Classification Search
CPC  G06F 17/5081; G06F 17/5072; H01L 21/265; H01L 21/8238; H01L 27/0629; H01L 28/22; H02J 7/0044
See application file for complete search history.

(56) References Cited

U.S. PATENT DOCUMENTS

| | | | | |
|---|---|---|---|---|
| 4,298,401 A | * | 11/1981 | Nuez | H01L 29/8605 257/379 |
| 4,345,477 A | * | 8/1982 | Johnson | G01L 1/2281 257/419 |
| 5,465,005 A | | 11/1995 | Eklund et al. | |
| 6,261,915 B1 | | 7/2001 | Eklund et al. | |
| 6,333,238 B2 | * | 12/2001 | Baldwin | 257/E21.004 |

(Continued)

OTHER PUBLICATIONS

Macdouga et al.; "High value implanted resistors for microcircuits"; Year: 1969; Proceedings of the IEEE, vol. 57, Issue: 9; pp. 1538-1542.*

(Continued)

*Primary Examiner* — Helen Rossoshek
(74) *Attorney, Agent, or Firm* — Jacqueline J. Garner; Charles A. Brill; Frank D. Cimino

(57) ABSTRACT

A method for adding a low TCR resistor to a baseline CMOS manufacturing flow. A method of forming a low TCR resistor in a CMOS manufacturing flow. A method of forming an n-type and a p-type transistor with a low TCR resistor in a CMOS manufacturing flow.

9 Claims, 8 Drawing Sheets

(56) References Cited

U.S. PATENT DOCUMENTS

| | | | |
|---|---|---|---|
| 6,703,294 B1* | 3/2004 | Schoner | C30B 31/22 257/E21.057 |
| 6,742,169 B2* | 5/2004 | Haraguchi | H01L 21/7621 257/204 |
| 6,798,024 B1* | 9/2004 | Hemmenway | H01L 21/763 257/370 |
| 6,812,108 B2* | 11/2004 | Hemmenway | H01L 21/763 257/E21.004 |
| 6,820,246 B2* | 11/2004 | Hino | H01L 21/7621 257/57 |
| 7,038,297 B2* | 5/2006 | Voorde | H01L 29/8605 257/358 |
| 7,314,829 B2* | 1/2008 | Weiss | H01L 23/5228 257/E21.004 |
| 7,618,850 B2* | 11/2009 | Kumar | G11C 11/5692 257/296 |
| 7,667,156 B2* | 2/2010 | Grudin | H01C 17/267 219/68 |
| 7,949,983 B2* | 5/2011 | Eshun | H01C 7/06 716/103 |
| 8,185,230 B2* | 5/2012 | Miller | H01L 22/20 700/121 |
| 8,819,603 B1* | 8/2014 | Clark | G06F 17/5068 365/185.23 |
| 9,269,758 B2* | 2/2016 | Yang | H01L 27/0629 |
| 2001/0025367 A1* | 9/2001 | Hayashi | G06F 17/5018 716/115 |
| 2001/0046771 A1 | 11/2001 | Steinmann et al. | |
| 2003/0036276 A1* | 2/2003 | Tsai | H01L 27/0676 438/694 |
| 2004/0245585 A1* | 12/2004 | Johnson | G01L 9/06 257/414 |
| 2005/0149887 A1* | 7/2005 | Chatterjee | G06F 17/505 716/115 |
| 2007/0159293 A1* | 7/2007 | Landsberger | H01C 17/232 338/22 R |
| 2009/0179280 A1* | 7/2009 | Kohli | H01L 21/26506 257/408 |
| 2009/0212854 A1* | 8/2009 | Baumgartner | H01L 29/4238 327/543 |
| 2009/0254872 A1* | 10/2009 | Brisbin | H01L 29/7835 716/100 |
| 2010/0025761 A1* | 2/2010 | Voldman | H01L 21/823892 257/338 |
| 2010/0112764 A1 | 5/2010 | Mehrotra et al. | |
| 2011/0068398 A1* | 3/2011 | Anderson | H01L 21/2255 257/347 |
| 2012/0181612 A1* | 7/2012 | Yang | H01L 27/0629 257/364 |
| 2013/0069691 A1* | 3/2013 | Sundareswaran | H03K 19/00315 326/38 |
| 2013/0111419 A1* | 5/2013 | Lin | H01L 21/26586 716/53 |
| 2013/0200466 A1* | 8/2013 | Zhao | H01L 27/0629 257/380 |
| 2013/0326438 A1* | 12/2013 | Lee | G06F 17/5031 716/55 |
| 2014/0002188 A1* | 1/2014 | Chen | H03F 3/19 330/250 |

OTHER PUBLICATIONS

D. W. Lee, Fabrication Technology of Polysilicon Resistors using novel mixed process for analogue CMOS applications. Electronics Letters, 35, #7, (1999) p. 603.

* cited by examiner

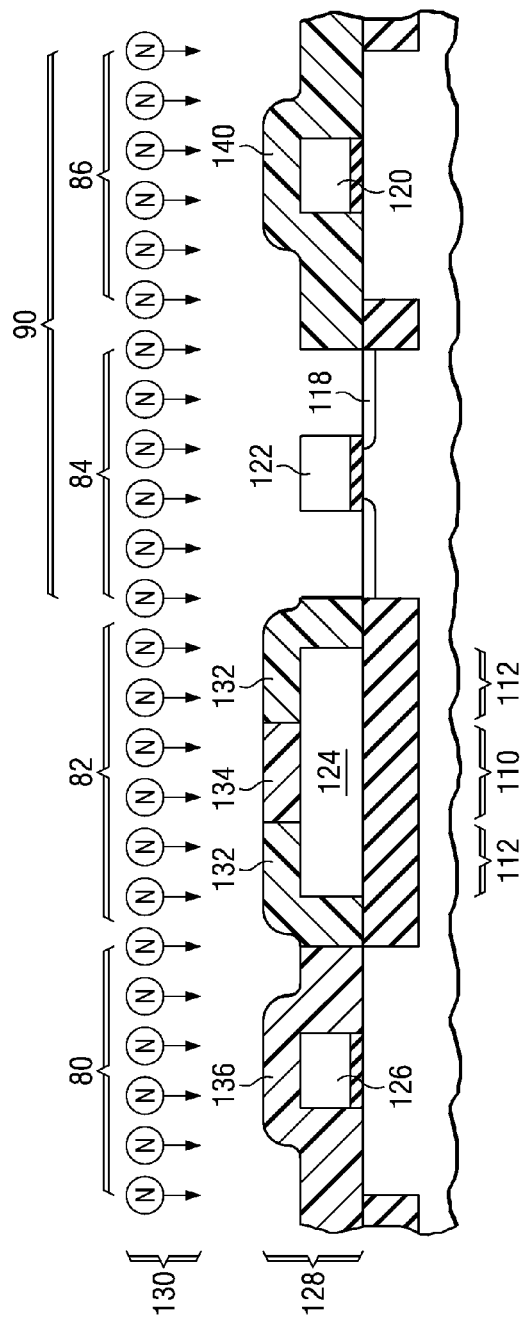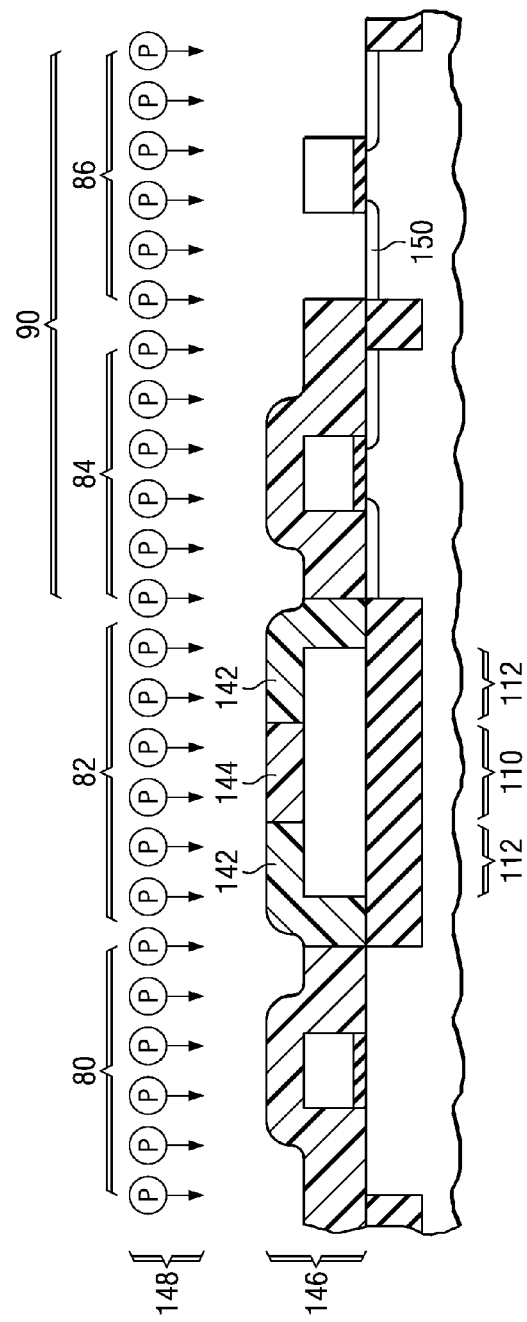

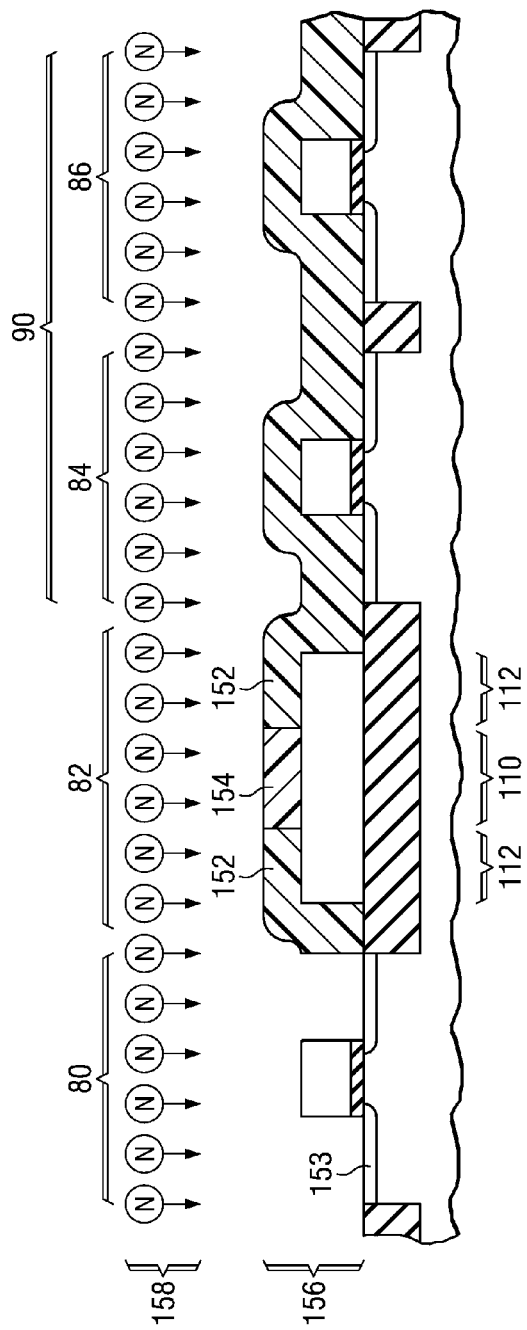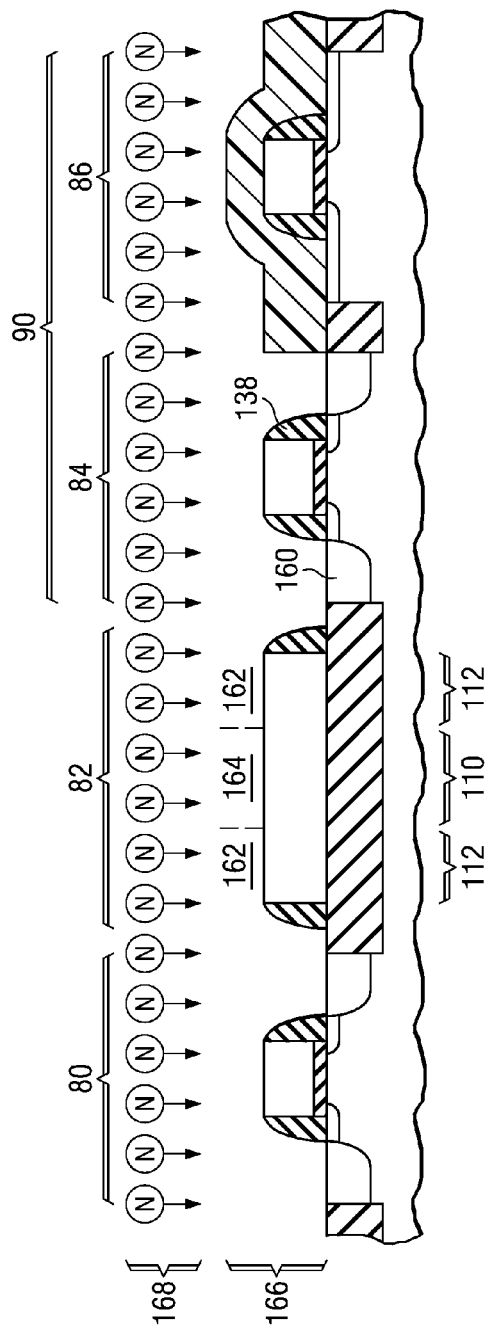

LOW TEMPERATURE COEFFICIENT RESISTOR IN CMOS FLOW

CROSS-REFERENCE TO RELATED APPLICATIONS

This application is a divisional of U.S. Nonprovisional patent application Ser. No. 13/288,700, filed Nov. 3, 2011, and claims the priority of U.S. provisional application Ser. No. 61/409,579, filed Nov. 3, 2010, the contents of which are herein incorporated by reference in its entirety.

FIELD OF THE INVENTION

This invention relates to the field of integrated circuits. More particularly, this invention relates to polysilicon resistors in CMOS integrated circuits.

BACKGROUND OF THE INVENTION

Modern integrated process flows typically may have many patterning and implantation steps to form the variety of transistors in an IC. For example, core transistors with low turn on voltage (vt), nominal vt, and high vt may be formed in addition to input/output (I/O) transistors and memory cell transistors such as SRAM transistors. Each transistor type typically requires a vt pattern and implant, gate doping pattern and implant, a source and drain extension pattern and implant, and a deep source and drain pattern and implant. A CMOS process flow typically builds both a pmos and nmos transistor of each transistor type. A CMOS flow with 3 core transistor types plus SRAM transistors and I/O transistors may have 20 or more patterning and implant steps to form 5 different nmos transistors and 5 different pmos transistors. In addition if other embedded devices, such as resistors, capacitors or bipolar transistors are constructed, additional patterns and implant steps may be added.

Electronic digital and analog integrated circuits often require resistors to perform the desired functions. One type of resistor which may be formed on an integrated circuit is a polysilicon resistor. N-type or p-type polysilicon resistors are typically formed using source/drain ion implantation or gate doping ion implantation.

One important property of embedded resistors, especially for analog circuits, is the temperature coefficient of resistance (TCR) which measures the change in resistance with a change in temperature. To reach sufficiently low TCR, the impurity of doping concentration must be very high, about $3 \times 10^{20}/cm^3$ for polysilicon resistors. Typically, additional implants are performed in an integrated process flow with embedded polysilicon resistors to provide resistors with low TCR. These additional implants usually require one or more additional photomask levels and add cost and cycle time to the integrated circuit process flow.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A method for adding a low TCR resistor to a baseline CMOS manufacturing flow. A method of forming a low TCR resistor in a CMOS manufacturing flow. A method of forming an n-type and p-type transistor with a low TCR resistor in a CMOS manufacturing flow.

DESCRIPTION OF THE VIEWS OF THE DRAWING

FIG. 4A through FIG. 4J are cross sections of an integrated circuit containing a CMOS circuit and a low TCR gate material resistor, referred to hereinafter as the resistor, formed according to an embodiment, depicted in successive stages of fabrication.

DETAILED DESCRIPTION OF EXAMPLE EMBODIMENTS

Figure 1:
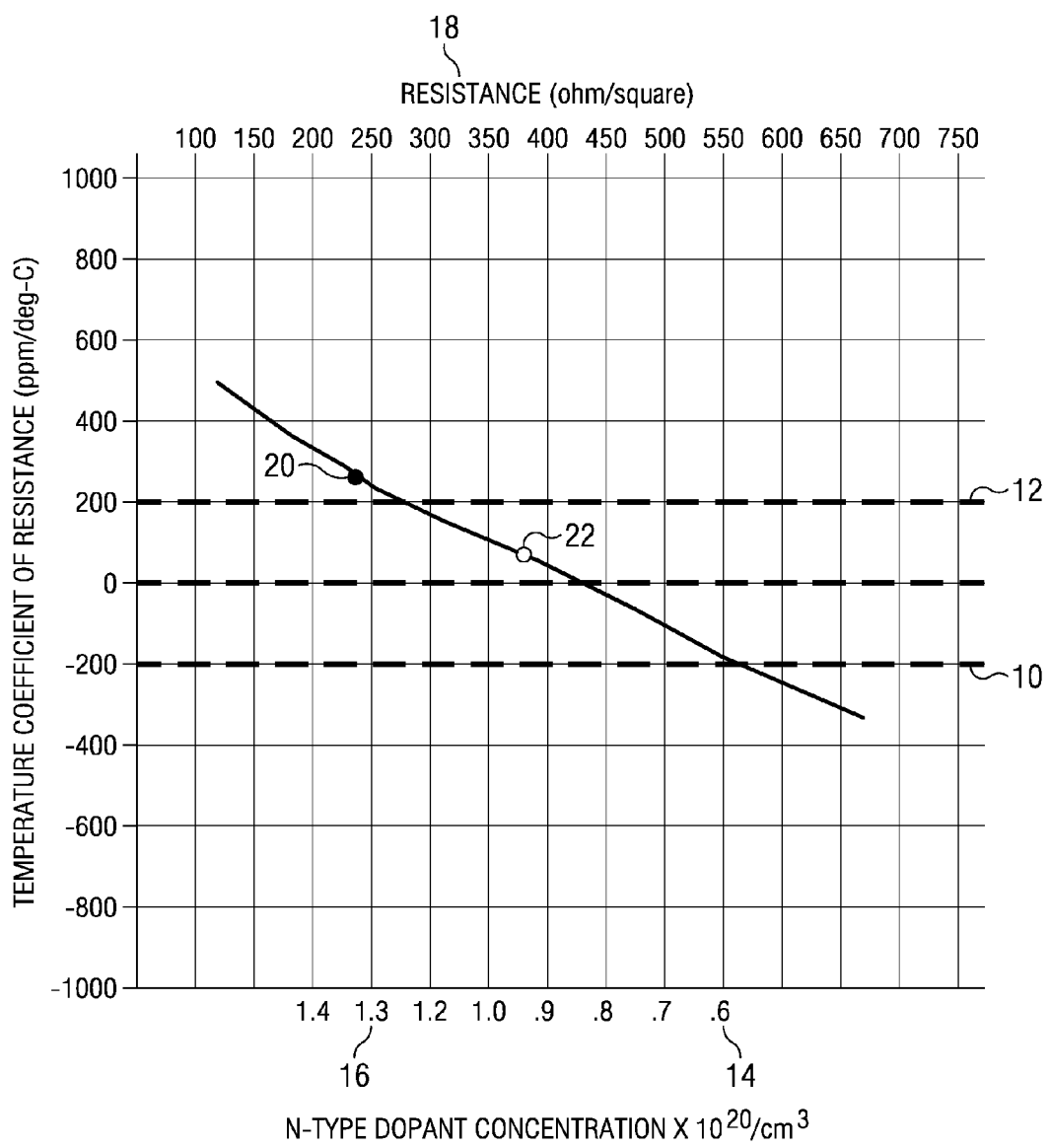
FIG. 1 is a graph of the temperature coefficient of a resistor versus n-type doping density according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing CMOS circuits which include polysilicon gate NMOS transistors and polysilicon gate PMOS transistors to form logic gates may also contain a polysilicon gate material resistor with a low temperature coefficient (TCR) formed by ion implanting the body region of the resistor concurrently using implants already in a baseline CMOS process flow. Implants used to form the NMOS and PMOS transistors in the CMOS logic circuits, such as the pre gate etch poly doping implants, LDD implants, and source and drain implants may concurrently implant the resistor body region. A silicide block layer is formed over the resistor body region prior to forming metal silicide on source and drain regions of the NMOS and PMOS transistors. The silicide block layer may be formed separately from the sidewall spacers on the NMOS and PMOS gates. Head regions of the resistor are ion implanted concurrently with a combination of the implants used to form the NMOS and PMOS transistors in the CMOS logic circuits, so that the head regions are the same conductivity type as the body region. In example embodiments, no additional photoresist patterns are added to the baseline CMOS process flow to form the low TCR resistor. Implants from the baseline process flow may be modified to improve the TCR resistor as long as the change does not negatively impact the baseline CMOS device that is implanted concurrently.

An n-type resistor with a low temperature coefficient of resistance (low TCR resistor) is used to illustrate embodiments, but a p-type resistor may also be used.

The term "acceptable specification range dose" refers to the implant dose range that may be used to manufacture a device that is within manufacturing specifications. For example, the n-type pre gate etch implant into polysilicon may be changed within in a range from about $5E14/cm^2$ to about $5E15/cm^2$ in many baseline CMOS process flows with the nmos transistors still falling within the acceptable specification range.

The term "TCR" refers to TCR1 in the equation $$\frac{R(T) - R_0}{R_0} = TCR1 * (T - T_0) + TCR2 * (T - T_0)^2$$

where $R_0$ is the resistance of the low TCR resistor at room temperature, $R(T)$ is the resistance of the low TCR resistor at temperature T, TCR1 is the linear temperature coefficient in units of ppm/deg-C and TCR2 is the quadratic coefficient in units of $ppm/(deg-C)^2$.

FIG. 1 is a graph of the TCR of an n-type polysilicon resistor versus the doping density. As shown on the bottom x-axis an n-type dopant density from about $6E20/cm^3$, (14 in graph), to about $1.3E21/cm^3$, (16 in graph), gives an n-type resistor with a TCR between about +200 ppm, (12 in graph), and -200 ppm, (10 in graph). In an example embodiment, pregate etch poly doping of $5E15/cm^2$ phosphorus plus the NSD implants of $2.5E15/cm^2$ phosphorus plus $2E15/cm^2$ arsenic into 70 nm thick poly results in a doping density in a polysilicon resistor of about $1.35 E21/cm^3$ (20 in graph) with a TCR of about 250 ppm/C which is outside the 0+/-200 ppm/C TCR specification requirement for the example embodiment. In addition the resistance of the polysilcon resistor is about 240 ohms/square, (18 in graph). One method to lower the TCR may be to lower the NSD and pregate etch poly doping concentration. Reducing the doping of the NSD may cause an undesirable increase in series resistance of the nmos transistor resulting in reduced performance. Reducing the pregate etch poly doping concentration may increase the effective gate dielectric thickness which may result in an increase in short channel effects and also may result in reduced nmos transistor performance. An embodiment solution which reduces the TCR of the polysilicon resistor 20 so that it meets TCR specifications (22 in graph) with no change in doping density of the n-type dopants is to additionally implant carbon into the low TCR resistor. Carbon doping in the range of about $7E19/cm^3$ and about $3E20/cm^3$ may be added to reduce the TCR. In an example embodiment, a $2E15/cm^2$ carbon dose was implanted into a 70 nm thick polysilicon resistor to reduce the TCR from about 250 ppm/C 20 to about 90 ppm/C 22 as shown in FIG. 1 with an increase in resistance from about 200 ohm/square 20 to about 370 ohms/square 22. With a carbon implant, the TCR may be reduced to within the specification range without reducing the doping density of the n-type dopants which might cause deleterious effects to other electrical components. In addition, the carbon implant may be added to raise the resistance of the low TCR resistor while keeping it within the TCR specification. For example, in an example embodiment, the sheet resistance of a 70 nm thick low TCR polysilicon resistor is raised by about 60-70 ohms/square by the addition of $1E15/cm^2$ carbon dose. In addition, TCR is reduced by about 60-80 ppm/C by the addition of a $1E15/cm^2$ carbon dose. In the example embodiment in FIG. 1 the resistance of the low TCR resistor could be raised from about 370 ohms/square to about 500 ohms/square by the addition of $2E15/cm^2$ carbon. With an additional $2E15/cm^2$ carbon, the TCR is reduced from about 90 ppm/C to about -50 ppm/C which is within the 0+/-200 ppm/C specification.

A graph similar to the graph in FIG. 1 may be drawn for a low TCR p-doped resistor. For an embodiment p-type polysilicon resistor the target boron doping density for a TCR in the specification range of 0+/-200 ppm/C is about $2E20/cm^3$ to about $8E20/cm^3$. A carbon implant may be added to lower the TCR or to raise the resistance of a p-type low TCR resistor. A carbon dose of about $1E15/cm^2$ implanted into a 70 nm thick p-type polysilicon resistor may reduce the TCR by about 150 to 180 ppm/C and may raise the resistance by about 200 to 250 ohms/square.

Figure 2:
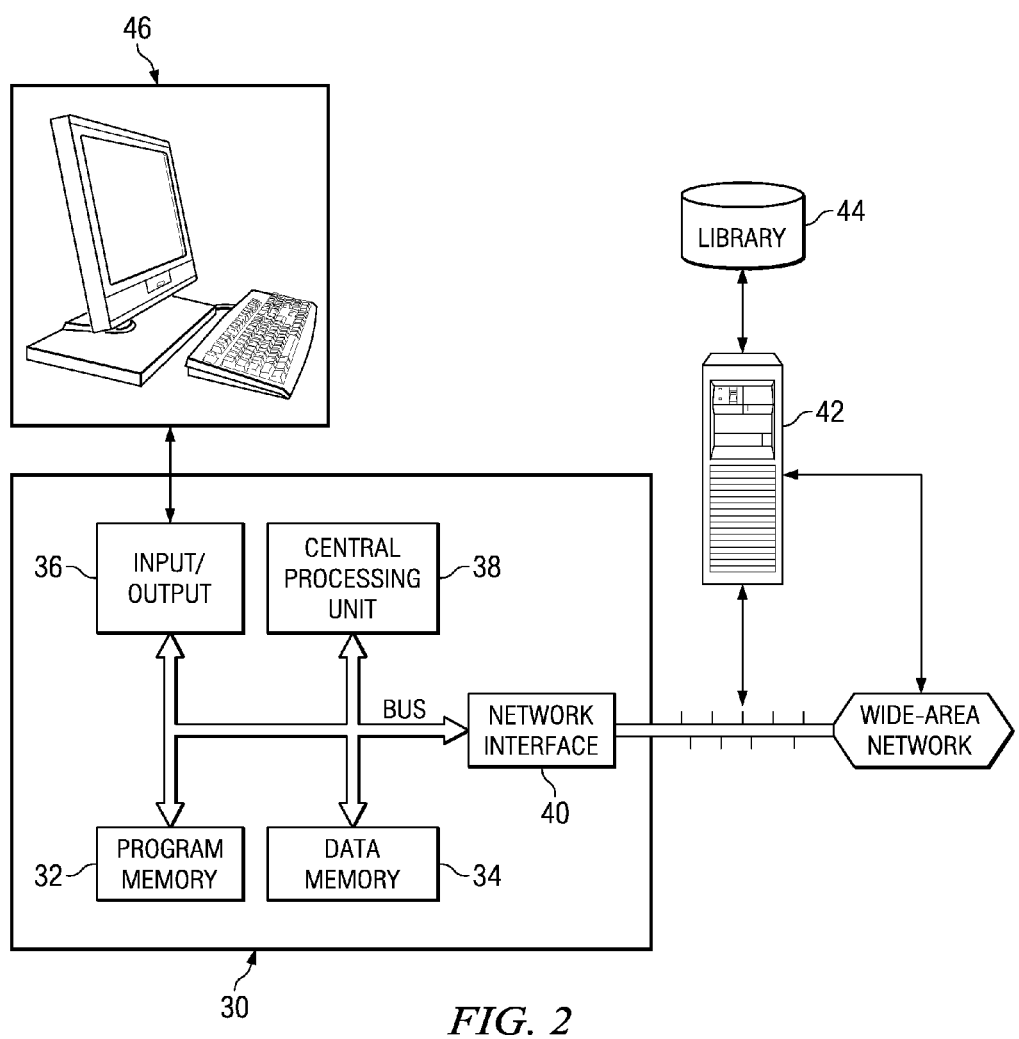
FIG. 2 is an electrical diagram, in schematic form, illustrating a computer system for modifying a baseline CMOS process flow to add a low TCR resistor according to principles of this invention.

Referring to FIG. 2 computing system 30 for modifying a baseline process flow of an integrated circuit to add a low TCR resistor according to embodiments of this invention will now be described.

FIG. 2 illustrates the construction of a system used to modify a baseline CMOS manufacturing flow of an integrated circuit according to an embodiment of the invention. In this example, the baseline flow modification system is as realized by way of a computer system including workstation 30 connected to server 42 by way of a network through network interface 40. Of course, the particular architecture and construction of a computer system useful in connection with this invention can vary widely. For example, the interconnect and via layout modification system may be realized by a single physical computer, such as a conventional workstation or personal computer, or alternatively may be a computer system implemented in a distributed manner over multiple physical computers. Accordingly, the generalized architecture illustrated in FIG. 2 is provided by way of example only.

As shown in FIG. 2, workstation 30 includes central processing unit (CPU) 38, coupled to the system bus BUS. Also coupled to system bus BUS is input/output interface 36 which refers to those interface resources by way of which peripheral functions 46 (e.g., keyboard, mouse, display, etc.) communicate with the other constituents of workstation 30. CPU 38 refers to the data processing capability of workstation 30, and as such may be implemented by one or more CPU cores or co-processing circuitry. The particular construction and capability of central processing unit 38 is selected according to the application needs of workstation 30. In the architecture of layout modification system according to this example, program memory 32 and data memory 34 are coupled to the system bus BUS. The workstation 30 and server 42 may also be coupled to a library 44 which may store programs, data, and integrated circuit manufacturing flows and data such as TCR as a function of doping density for n-type and p-type doped polysilicon resistors.

Figure 3:
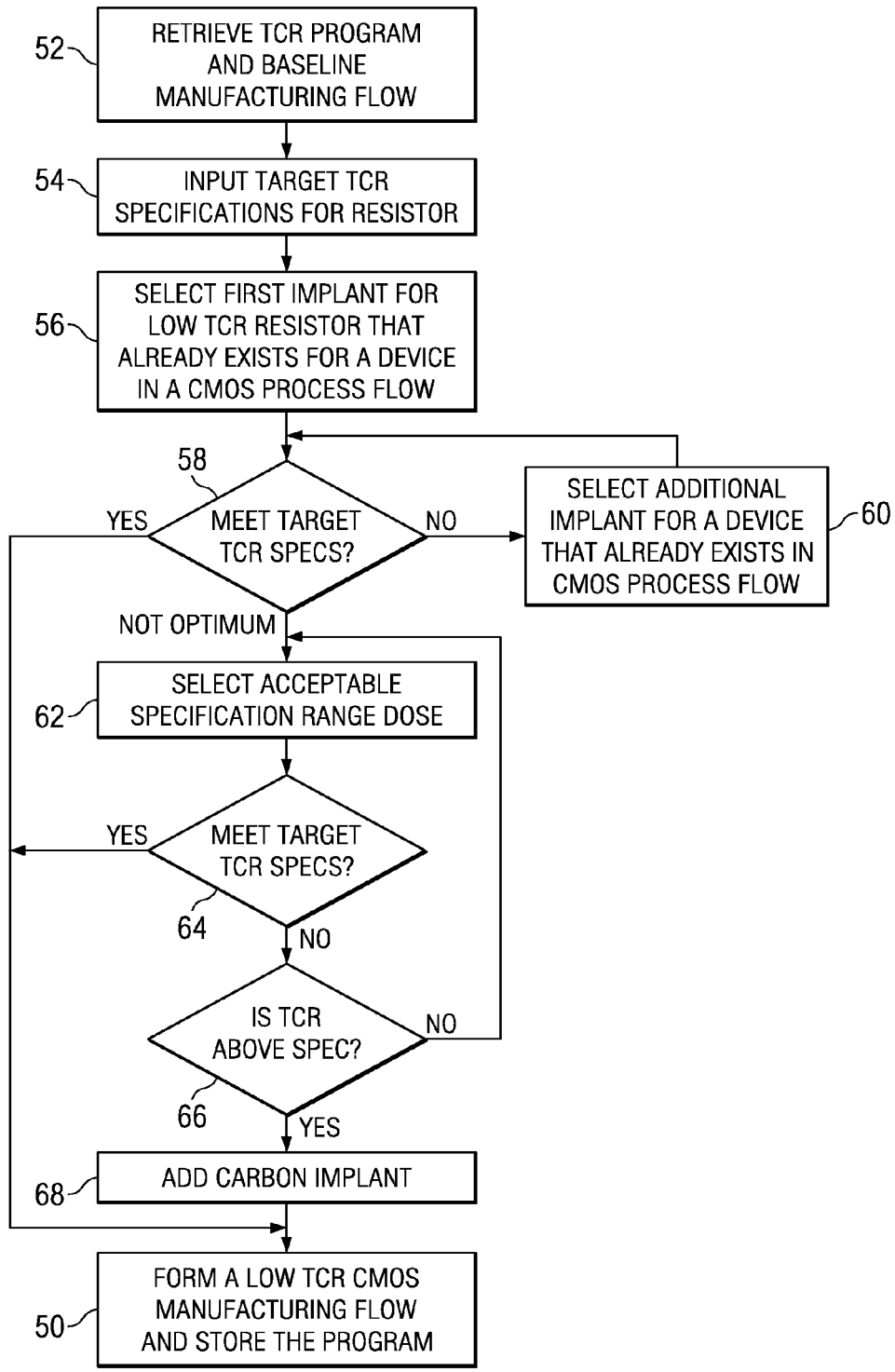
FIG. 3 is a flow diagram illustrating the operation of the computer system for modifying a baseline CMOS manufacturing flow to add a low TCR resistor according to principles of this invention.

FIG. 3 is a process flow diagram illustrating an embodiment method for adding a low TCR resistor to a baseline CMOS process flow without adding any additional photoresist patterning steps. With the embodiment method a low TCR resistor may be added to a baseline CMOS process flow and the resistance value of the low TCR resistor may be adjusted with little or no additional manufacturing cost.

The term "baseline CMOS manufacturing flow" refers to a baseline CMOS manufacturing flow which may be used to manufacture an integrated circuit. The baseline CMOS manufacturing flow builds core CMOS transistors and may also build other devices such as input/output transistors, memory transistors, capacitors, resistors, inductors, etc.

The term "low TCR CMOS manufacturing flow" refers to a baseline CMOS manufacturing flow that has been changed to include a low TCR polysilicon resistor.

The term "active dopant" refers to an n-type dopant or a p-type dopant which is electrically active. For example, phosphorus and boron are active dopants whereas carbon is a passive dopant because it is not electrically active.

In the embodiment process illustrated by the flow diagram in FIG. 3, the workstation 30 may retrieve the baseline CMOS manufacturing flow and the TCR program in step 52 from the server 42 or from data storage such as library 44. In addition data regarding how the TCR and resistance changes as a function of n-type or p-type doping density and as a function of carbon doping may be retrieved in step 52. In step 54 the resistance and TCR specifications may be entered using an external device such as a keyboard 46. The TCR resistor program may then search through the manufacturing flow and select a first implant in step 56. The dose is then checked to see if TCR specifications are met in step 58. If the specifications are met, the program proceeds to step 50 which specifies which implants goes into the resistor geometry.

If, however, the specifications are not met, the method proceeds to step 60 and selects an additional implant for the low TCR resistor. The method then proceeds back to step 58 to check if the specifications are met with the combination of the first implant plus the additional implant. Steps 60 and 58 may be repeated until the specifications are met or until it is determined that the specifications cannot be met using existing implantation steps from the baseline manufacturing flow.

If it is determined that the specifications cannot be met or that the combination of implantations from the baseline manufacturing flow are not optimum, the method proceeds to step 62 where an acceptable specification range dose is selected. For example, the dose of the pregate etch polysilicon doping implant may be changed from the baseline value to a value that is within the acceptable range, that is within a range that does not cause any of the baseline devices to fall out of specification. After selecting an acceptable specification range dose the method proceeds to step 64 to check if the TCR specification is met. If the specification is met the method proceeds to step 50 where the program specifies which implants are to go into the resistor geometry and also replaces the baseline implant dose with the acceptable specification range dose in the manufacturing flow.

If the target TCR specification is not met in step 64 the method proceeds to step 66 which checks if the TCR is above specification. If the TCR is less than specification the method goes back to step 62 to select an additional acceptable specification range dose. Steps 62, 64 and 66 may be repeated as many times as needed.

If the combination of implants and acceptable specification range dose produces a TCR that is higher than specification, the method proceeds to step 68 which adds a carbon implant sufficient to reduce the TCR to into the acceptable specification range.

The embodiment method then proceeds to step 50 which specifies which implants are to be implanted into the resistor geometry and also modifies implantation steps in the baseline manufacturing to replace baseline implant doses with acceptable specification range doses and to add the carbon implant.

FIG. 4A through FIG. 4J are cross sections of an integrated circuit containing a CMOS circuit and a low TCR gate material resistor, referred to hereinafter as the resistor, formed according to an embodiment, depicted in successive stages of fabrication. The integrated circuit 70 includes an area defined for the CMOS circuit 90 which includes an area defined for an NMOS transistor 84 and an area defined for a PMOS transistor 86. The integrated circuit 70 also includes an area defined for the resistor 82. The integrated circuit may possibly contain an area defined for another component 80, depicted in FIG. 4A through FIG. 4I as a second NMOS transistor which is formed using at least one ion implant operation which is not used to form the CMOS circuit NMOS transistor 84 or the resistor 82.

The integrated circuit 70 is formed in and on a substrate 72 which may be a single crystal silicon wafer, a silicon-on-insulator (SOI) wafer, a hybrid orientation technology (HOT) wafer with regions of different crystal orientations, or other material appropriate for fabrication of the integrated circuit 70. Elements of field oxide 102 may be formed at a top surface of the substrate 72, for example to electrically isolate the NMOS transistor 84 from the PMOS transistor 86. In particular, an element of field oxide 102 may be formed in the polysilicon gate material resistor area 82 to electrically isolate the resistor from the substrate 72. The field oxide 102 may be silicon dioxide between 250 and 600 nanometers thick, formed by shallow trench isolation (STI) or local oxidation of silicon (LOCOS) processes. In STI processes, silicon dioxide may be deposited by high density plasma (HDP) or high aspect ratio process (HARP). An NMOS gate dielectric layer 106 is formed at the top surface of the substrate 72 in the NMOS transistor area 84. A PMOS gate dielectric layer 108 is formed at the top surface of the substrate 72 in the PMOS transistor area 86. A second NMOS gate dielectric layer 104 is formed at the top surface of the substrate 72 in the other component area 80. The gate dielectric layers 104, 106, and 108 may be one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The gate dielectric layers 104, 106 and 108 may include nitrogen as a result of exposure to a nitrogen containing plasma or nitrogen containing ambient gas at temperatures between 50 C. and 800 C. The gate dielectric layers 104, 106 and 108 may be between 1 and 15 nanometers thick, depending on drain voltages applied to drain nodes of the respective transistors. The gate dielectric layers 104, 106 and 108 may be formed by any of a variety of gate dielectric formation processes, for example thermal oxidation, plasma nitridation of an oxide layer, and/or dielectric material deposition by atomic layer deposition (ALD). Any portions or all of the gate dielectric layers 104, 106 and 108 may be formed concurrently.

A gate polysilicon layer 74 is formed over an existing top surface of the integrated circuit 70. The gate polysilicon layer 74 may be formed, for example, by thermally decomposing SiH4 gas inside a low-pressure reactor at a temperature between 580° C. to 650° C. The gate polysilicon layer 74 may be, for example, between 50 and 1000 nanometers thick. The gate polysilicon layer 74 may be doped during formation, or may be undoped. In an example embodiment the gate polysilicon layer 74 is about 70 nanometers thick.

An n-type pre gate etch implant operation 78 may be performed on the integrated circuit 70 which ion implants a pre etch set of n-type dopants into the portions of the gate polysilicon layer 74 in the NMOS transistor areas 80 and 84 and also into the low TCR resistor area. The n-type pre gate etch implant operation 78, may implant for example phosphorus at a dose of between $1\times10^{14}$ atoms/cm$^2$ and $1\times10^{16}$ atoms/cm$^2$. Optionally, a carbon implant in the range of about $5\times10^{14}$ atoms/cm$^2$ and $2\times10^{15}$ atoms/cm$^2$ may be added to adjust the resistance and TCR without changing the n-type doping density. In an example embodiment, an n-type pre gate etch implant mask 100 may be formed, for example of photoresist, over the gate polysilicon layer 74 to block the pre etch n-type dopants from the pmos area 86 and a phosphorus dose implanted. After the n-type pre gate etch implant operation 78 is completed, the n-type pre gate etch implant mask 100, is removed, for example by exposing the integrated circuit 70 to an plasma containing oxygen, followed by a wet cleanup to remove any organic residue.

In an example embodiment, phosphorus is implanted into the low TCR resistor area which includes the body area 110 and also the head areas 112. Typically the pre gate etch implant dose may be adjusted within a range from about 5E14/cm$^2$ to 5E15/cm$^2$ to form an acceptable specification range dose. In addition, a carbon implant may be added to this implant to adjust the resistance of the body 110 of the low TCR resistor 82 while keeping the n-type doping density constant. A carbon implant may be used to increase resistance without changing the work function of the polysilicon gate material. In an example embodiment a carbon implant dose of about 2E15/cm$^2$ is added to adjust the resistor TCR and resistance while keeping the n-type doping density the same.

Figure 4A:
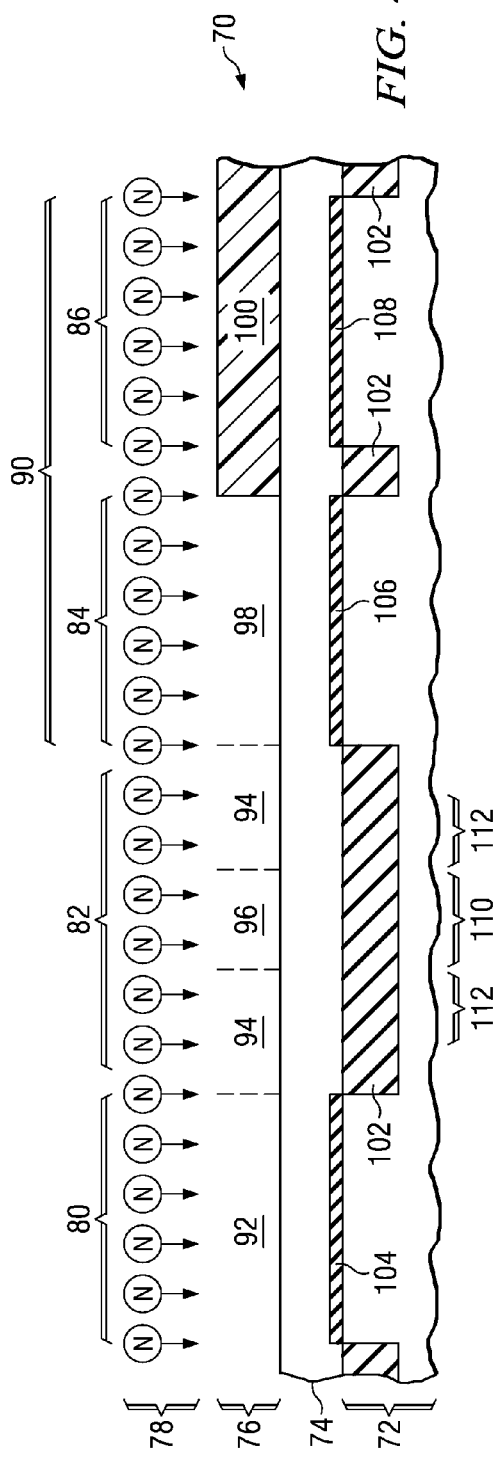
Figure 4B:
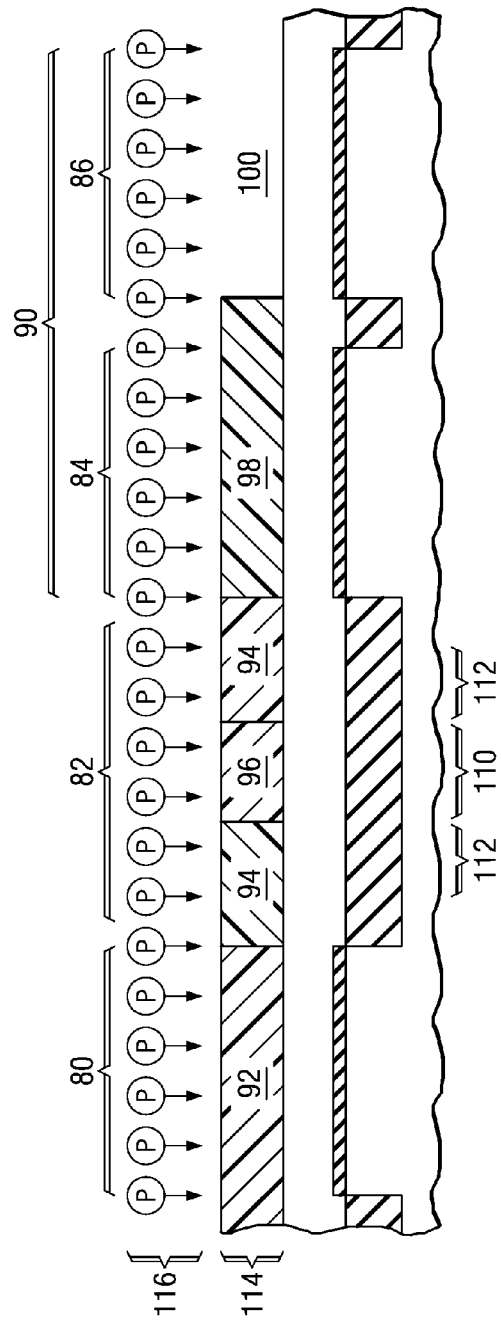

Referring to FIG. 4B, an optional p-type pre gate etch implant operation 116 may be performed on the integrated circuit 70 which ion implants a pre etch set of p-type dopants into at least a portion of the gate polysilicon layer 74. The optional p-type pre gate etch implant operation 116, if performed, may implant for example boron and possibly gallium and/or indium at a total dose between $1\times10^{14}$ atoms/cm$^2$ and $1\times10^{16}$ atoms/cm$^2$. In one version of the instant embodiment, the optional p-type pre gate etch implant operation 116 may be a blanket implant. Optionally, a carbon implant in the range of about $5\times10^{14}$ atoms/cm$^2$ and $5\times10^{15}$ atoms/cm$^2$ may be added to adjust the resistance and TCR without changing the p-type doping density. In other versions of the instant embodiment, an optional p-type pre gate etch implant mask 114 may be formed, for example of photoresist, over the gate polysilicon layer 74 to block the pre etch p-type dopants from some areas. The p-type pre gate etch implant mask 114 may include an NMOS blocking segment 98 which blocks the pre etch p-type dopants from the NMOS transistor area 84. The p-type pre gate etch implant mask 114 may include another component blocking segment 92 which blocks the pre etch p-type dopants from the other component area 80. The p-type pre gate etch implant mask 114 may include a resistor body blocking segment 96 which blocks the pre etch p-type dopants from the body region 110 of the resistor. The p-type pre gate etch implant mask 114 may include resistor head blocking segments 94 which blocks the pre etch p-type dopants from the head regions 112 of the resistor. After the optional p-type pre gate etch implant operation 116, if performed, is completed, the optional p-type pre gate etch implant mask 114, if formed, is removed, for example as described in reference to FIG. 4A. In one version of the instant embodiment, the optional p-type pre gate etch implant operation 116 may be performed before the optional n-type pre gate etch implant operation 78.

Referring to FIG. 4C, the gate polysilicon layer 74 of FIG. 4A is etched to form an NMOS gate 122 in the NMOS transistor area 84, a PMOS gate 120 in the PMOS transistor area 86, a second NMOS gate 126 in the other component area 80 and a resistor layer 124 in the resistor area 82. In one version of the instant embodiment, the gate polysilicon layer 74 may be etched, for example, by forming a gate etch hard mask layer, not shown, over the gate polysilicon layer 74, followed by a photoresist gate etch mask, not shown, formed by a photolithographic process. A gate etch process, including for example a reactive ion etch (RIE) process using a plasma containing fluorine, removes unwanted material from the gate etch hard mask layer and the gate polysilicon layer 44 using the photoresist gate etch mask to block removal by the RIE. The photoresist gate etch mask is removed during the gate etch process or after the gate etch process is completed. Other processes of etching the gate polysilicon layer 74, such as multiple pass lithography to form the gate etch mask, is within the scope of the instant embodiment.

An NLDD implant mask 128 is formed, for example of photoresist, over an existing top surface of the integrated circuit 70 so as to expose the NMOS transistor area 84. The NLDD implant mask 128 may include an NMOS blocking segment 140 in the pmos transistor area 86. The NLDD implant mask 128 may include an optional second NMOS blocking segment 136 in the other component area 80. The NLDD implant mask 128 may include an optional resistor body blocking segment 134 in the resistor area 82 over the body region 110. The NLDD implant mask 128 may include optional resistor head blocking segments 132 in the resistor area 82 over the head regions 132. In an example embodiment the NLDD implants are blocked from the resistor area 82 but in other example embodiments, the resistor area 82 may be opened to the NLDD implants.

An NLDD implant operation 130 is performed on the integrated circuit 70 which ion implants an NLDD set of n-type dopants into the substrate 72 in the NMOS transistor area 84 to form NLDD implanted layers 118 in the substrate 72 adjacent to the NMOS gate 122. The NLDD n-type dopants may include, for example phosphorus and arsenic and possibly antimony, implanted at a total dose between $2\times10^{14}$ atoms/cm$^2$ and $2\times10^{15}$ atoms/cm$^2$ at energies between 2 keV and 6 keV. The NLDD implant operation 130 may also implant p-type dopants in a high angle configuration known as a halo implant. The NLDD implant operation 130 may also implant carbon in the range of about 2E14/cm$^2$ to 8E14/cm$^2$ to form a sharper junction. The carbon atoms block interstitial diffusion of the n-type dopants without changing the n-type dopant density. A low carbon dose is typically used to avoid an undesirable increase in series resistance. If the optional resistor body blocking segment 134 is not formed, the NLDD implant operation 130 implants the NLDD set of n-type dopants, and the p-type halo dopants and carbon dopants if used, into the body region 110 of the resistor layer 124. If the optional resistor head blocking segments 132 are not formed, the NLDD implant operation 130 implants the NLDD set of n-type dopants, and the p-type halo dopants if used, into the head regions 112 of the resistor layer 124. After the NLDD implant operation 130 is completed, the NLDD implant mask 128 is removed, for example as described in reference to FIG. 4A.

Referring to FIG. 4D, a PLDD implant mask 146 is formed, for example of photoresist, over an existing top surface of the integrated circuit 70 so as to expose the PMOS transistor area 86. In the version of the instant embodiment depicted in FIG. 1D, the PLDD implant mask 146 covers the other component area 80. In other versions of the instant embodiment, for example in versions in which the other component is a second PMOS transistor, the PLDD implant mask 146 may expose the other component area 80. The PLDD implant mask 146 may include an optional resistor body blocking segment 144 in the resistor area 82 over the body region 110. The PLDD implant mask 146 may include optional resistor head blocking segments 142 in the resistor area 82 over the head regions 112.

A PLDD implant operation 148 is performed on the integrated circuit 70 which ion implants a PLDD set of p-type dopants into the substrate 72 in the PMOS transistor area 86 to form PLDD implanted layers 150 in the substrate 72 adjacent to the PMOS gate 120. The PLDD p-type dopants may include, for example boron and boron difluoride and possibly gallium and/or indium, implanted at a total dose between $5 \times 10^{14}$ atoms/cm$^2$ and $5 \times 10^{15}$ atoms/cm$^2$ at energies between 1 keV and 8 keV. The PLDD implant operation 148 may also implant n-type dopants in a halo implant. The PLDD implant operation 148 may also implant carbon in the range of about 2E14/cm$^2$ to 8E14/cm$^2$ to form a sharper junction. The carbon atoms block interstitial diffusion of the p-type dopants without changing the p-type dopant density. A low carbon dose is typically used to avoid an undesirable increase in series resistance. If the optional resistor body blocking segment 144 is not formed, the PLDD implant operation 148 implants the PLDD set of p-type dopants, and the n-type halo dopants if used, into the body region 110 of the resistor layer 124. If the optional resistor head blocking segments 142 are not formed, the PLDD implant operation 148 implants the PLDD set of p-type dopants, and the n-type halo dopants if used, into the head regions 112 of the resistor layer 124. After the PLDD implant operation 148 is completed, the PLDD implant mask 146 is removed, for example as described in reference to FIG. 4A.

Referring to FIG. 4E, an optional other component NLDD2 implant mask 156 may be formed over an existing top surface of the integrated circuit 70 so as to form doped layers 153 adjacent to the optional device transistor gate 126 and to cover the CMOS area 90 and the resistor area 82. The other component implant operation 158 is performed on the integrated circuit 70 which implants dopants into the integrated circuit 70 in the other component area 80. In the illustrative NLDD2 embodiment, the NLDD2 n-type dopants may include, for example phosphorus and arsenic and possibly antimony, implanted at a total dose between $2 \times 10^{14}$ atoms/cm$^2$ and $2 \times 10^{15}$ atoms/cm$^2$ at energies between 2 keV and 6 keV. The NLDD2 implant operation 158 may also implant p-type dopants in a high angle configuration known as a halo implant and may also implant carbon atoms to form a sharper NLDD2 junction.

If the optional resistor body blocking segment 154 is not formed, the NLDD2 implant operation 158 implants the NLDD2 set of n-type dopants, and the p-type halo dopants if used, into the body region 110 of the resistor layer 124. If the optional resistor head blocking segments 152 are not formed, the NLDD2 implant operation 158 implants the NLDD2 set of n-type dopants, and the p-type halo dopants if used, into the head regions 112 of the resistor layer 124. After the NLDD2 implant operation 158 is completed, the NLDD implant mask 156 is removed, for example as described in reference to FIG. 4A.

Referring to FIG. 4F, sidewall spacers 138 are formed abutting the NMOS gate 122, the PMOS gate 120, the second NMOS gate 126 and the resistor layer 124. The sidewall spacers 138 may be formed, for example, by formation of one or more conformal layers of silicon nitride and/or silicon dioxide on a an existing top surface of the integrated circuit 40, followed by removal of the conformal layer material from horizontal surfaces by anisotropic etching methods, leaving the conformal layer material abutting the NMOS gate 122, the PMOS gate 120, the second NMOS gate 126 and the resistor layer 124.

Following formation of the sidewall spacers 138, an NSD implant mask 168 is formed, for example of photoresist, over an existing top surface of the integrated circuit 70 so as to expose the NMOS transistor area 84 and body region 110 of the resistor layer 124. Depending upon the TCR resistor doping requirements, the NSD implant mask 166 may include an optional resistor body blocking segment 164 in the resistor area 82 over the body region 110. The NSD implant mask 166 may include optional resistor head blocking segments 162 in the resistor area 82 over the head regions 112. In this illustrative example the optional other component area 86 is also open to the NSD implant 168.

An NSD implant operation 168 is performed on the integrated circuit 70 which ion implants an NSD set of n-type dopants into the substrate 72 in the NMOS transistor area 84 and the optional other NMOS transistor area 80 to form NSD layers 160 in the substrate 72 adjacent to the NMOS gate 122 and adjacent to optional other component NMOS gate 126. The NSD n-type dopants may include, for example phosphorus and arsenic and possibly antimony, implanted at a total dose between $2 \times 10^{15}$ atoms/cm$^2$ and $2 \times 10^{16}$ atoms/cm$^2$ at energies between 1 keV and 6 keV. The NSD implant operation 168 may also implant carbon in the range of about 2E14/cm$^2$ to 1E15/cm$^2$ to form a sharper junction. The carbon atoms block interstitial diffusion of the n-type dopants without changing the n-type dopant density. A low carbon dose is typically used to avoid an undesirable increase in series resistance. If the optional resistor head blocking segments 162 are not formed, the NSD implant operation 168 implants the NSD set of n-type dopants into the head regions 112 of the resistor layer 124. After the NSD implant operation 168 is completed, the NSD implant mask 166 is removed, for example as described in reference to FIG. 4A.

In an example embodiment the resistor area 82 is open to the NSD implant operation 168 implants 2E15/cm$^2$ arsenic plus 2E15/cm$^2$ phosphorus which includes low TCR resistor body 110 and low TCR resistor heads 112. The NSD implant operation 168 plus the n-type pre gate etch implant operation 78 which implants 1E15/cm$^2$ phosphorus gives a low TCR resistor total n-type doping concentration of about 7E20/cm$^3$ and a TCR within the 0+/−200 ppm specification range.

Figure 4G:
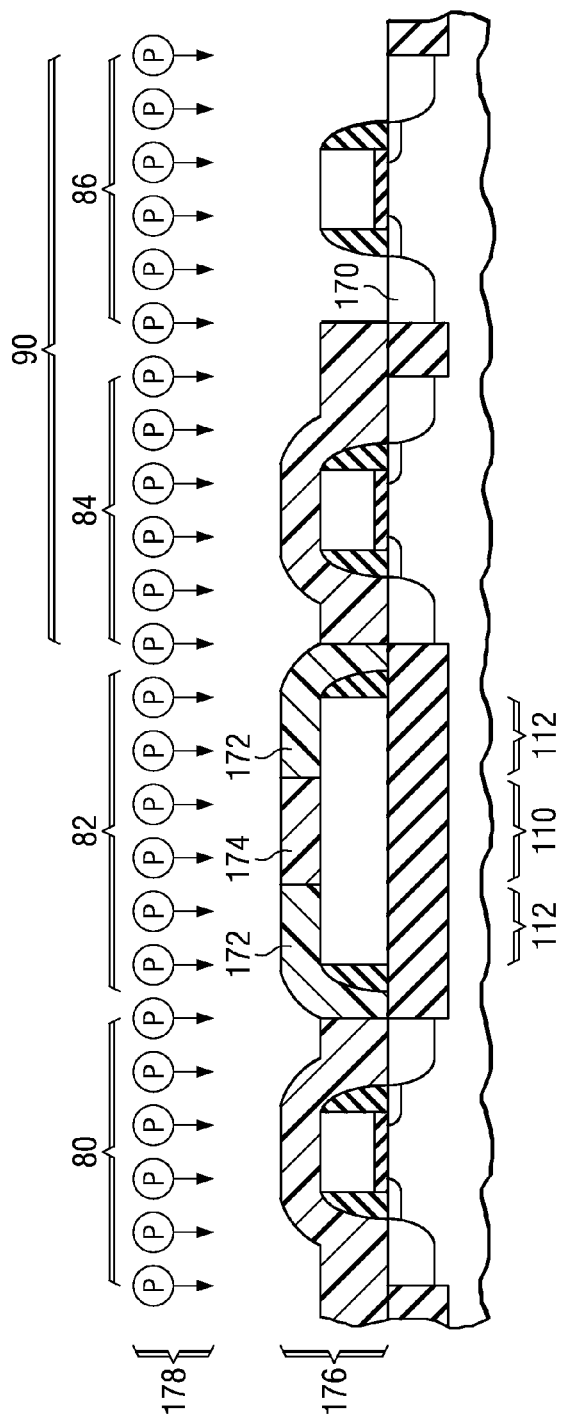

Referring to FIG. 4G, a PSD implant mask 178 is formed, for example of photoresist, over an existing top surface of the integrated circuit 72 so as to expose the PMOS transistor area 86. In the version of the instant embodiment depicted in FIG. 4G, the PSD implant mask 176 covers the other component area 80, the resistor area 82, and the NMOS transistor area 84. In other versions of the instant embodiment, for example in versions in which the other component is a second PMOS transistor, the PSD implant mask 176 may expose the other component area 80. The PSD implant mask 176 may include optional resistor head blocking segments 172 in the resistor area 82 over the head regions 112. The PSD implant mask 176 may include an optional resistor body blocking segment 174 in the resistor area 82 over the body region 110.

A PSD implant operation 178 is performed on the integrated circuit 70 which ion implants a PSD set of p-type dopants into the substrate 72 in the PMOS transistor area 86 to form PSD layers 170 in the substrate 72 adjacent to the PMOS gate 120. The PSD p-type dopants may include, for example boron and possibly gallium and/or indium, implanted at a total dose between $2 \times 10^{15}$ atoms/cm$^2$ and $1 \times 10^{16}$ atoms/cm$^2$ at energies between 1 keV and 8 keV. The PSD implant operation 178 may also implant carbon in the range of about 2E14/cm$^2$ to 1E15/cm$^2$ to form a sharper junction. The carbon atoms block interstitial diffusion of the p-type dopants without changing the p-type dopant density. A low carbon dose is typically used to avoid an undesirable increase in series resistance. If the optional resistor head blocking segments 172 are not formed, the PSD implant operation 178 implants the PSD set of p-type dopants into the head regions 112 of the resistor layer 124. After the PSD implant operation 178 is completed, the PSD implant mask 176 is removed, for example as described in reference to FIG. 4A. The head regions 82 have a same conductivity type as the body region 80.

Figure 4H:
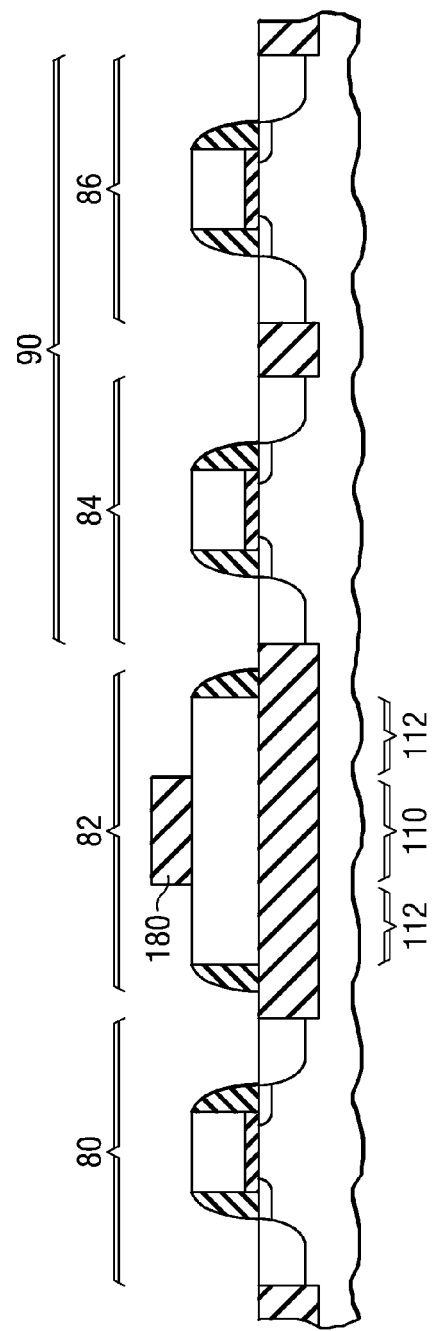

Referring to FIG. 4H, a resistor silicide block layer 180 is formed over the body region 110 of the resistor layer 124. Material in the resistor silicide block layer 180 may or may not form concurrently with material in the sidewall spacers 154. The resistor silicide block layer 180 may be formed, for example, of silicon dioxide between 10 and 200 nanometers thick by thermal decomposition of tetraethyl orthosilicate, also known as tetraethoxysilane or TEOS. Forming the resistor silicide block layer 180 using other materials is within the scope of the instant embodiment. In the instant embodiment, the resistor silicide block layer 150 completely covers the body region 110 but may expose the head regions 112. For low TCR resistors in which the source and drain implants are blocked from the transistor body region 110, the sidewall 154 material may be used for silicide block 180.

Figure 4I:
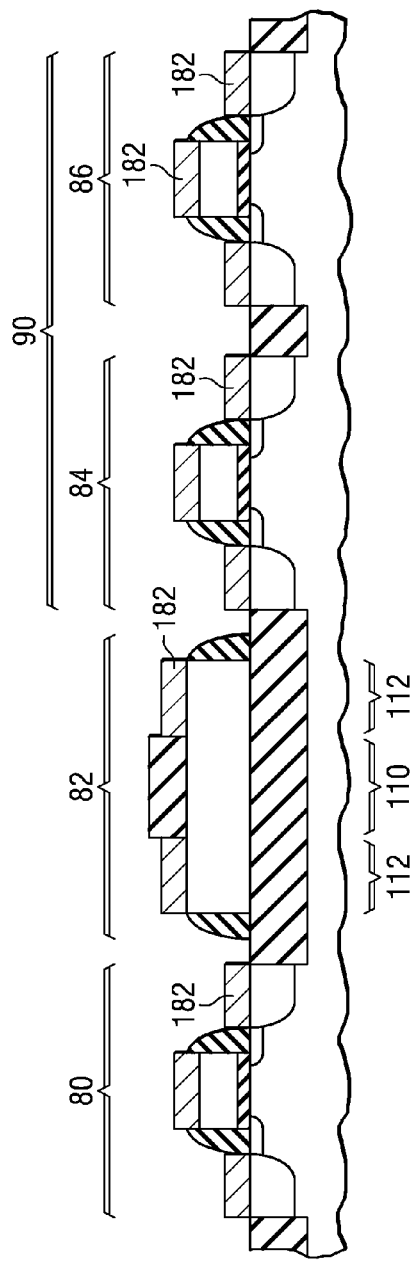

Referring to FIG. 4I, metal silicide layers 182 are formed on exposed silicon at an existing top surface of the integrated circuit 70, for example on the NSD layers 160 and gate 122 of the NMOS transistor 84, on the PSD layers 170 and gate 120 of the PMOS transistor 86, on the head regions 112 of the resistor 82, and on the other component 80 if formed. The metal silicide layers 182 may be formed, for example, by depositing a layer of metal, such as titanium, cobalt, nickel, or platinum on a top surface of the integrated circuit 70, heating the integrated circuit 70 to react a portion of the metal with exposed silicon at the existing top surface of the integrated circuit 70, and selectively removing unreacted metal from the integrated circuit 70 surface, commonly by exposing the integrated circuit 70 to wet etchants including a mixture of an acid and hydrogen peroxide.

Figure 4J:
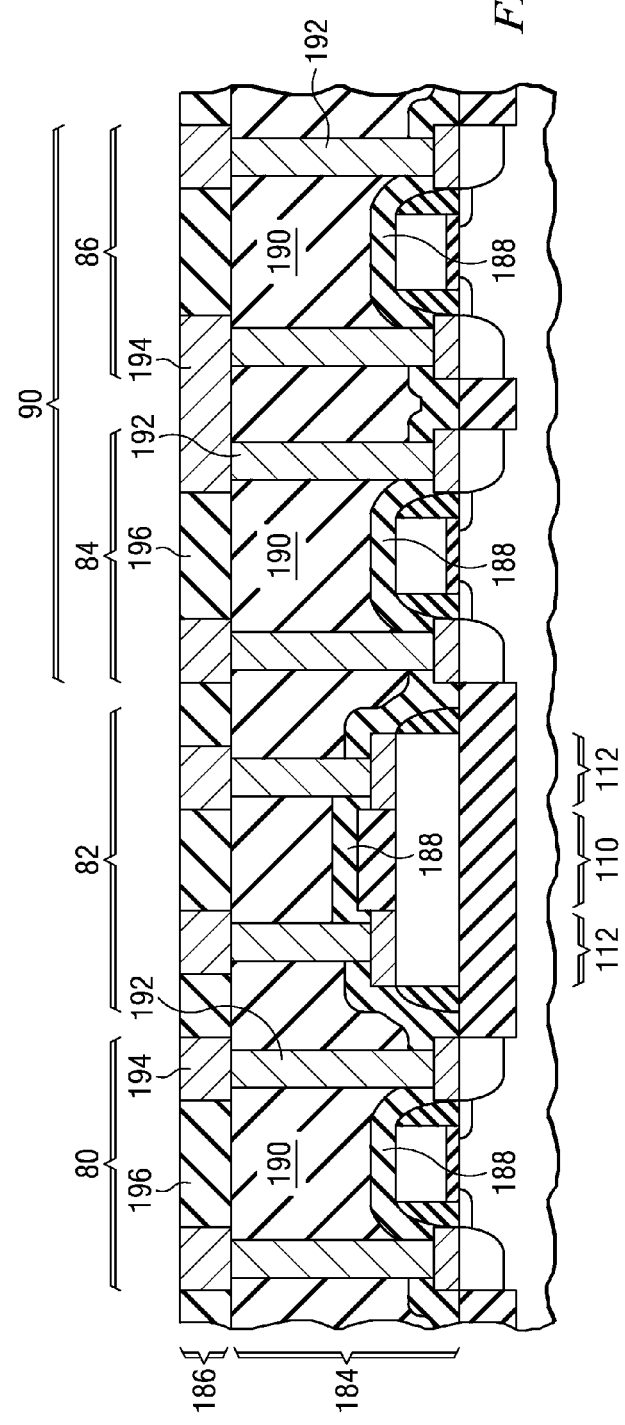

Referring to FIG. 4J, a pre-metal dielectric (PMD) layer 190 is formed over an existing top surface of the integrated circuit 70. The PMD layer 190 may include a PMD liner 188, a PMD main layer 190, and an optional PMD cap layer, not shown. The PMD liner 188 also referred to as a contact etch stop liner or as a dual stress liner is commonly silicon nitride or silicon dioxide, 10 to 100 nanometers thick, deposited by plasma enhanced chemical vapor deposition (PECVD) on the existing top surface of the integrated circuit 70. The PMD main layer 190 may be a layer of silicon dioxide formed by a HARP process followed by a layer of silicon dioxide, phospho-silicate glass (PSG) or boro-phospho-silicate glass (BPSG), commonly 100 to 1000 nanometers thick, deposited by a PECVD process on a top surface of the PMD liner 188, and sometimes leveled by a chemical-mechanical polish (CMP) process. The optional PMD cap layer is commonly 10 to 100 nanometers of a hard material such as silicon nitride, silicon carbide nitride or silicon carbide, formed on a top surface of the PMD main layer 190 after planarization.

Contacts 192 are formed through the PMD main layer 190 and through the PMD liner 188 to make electrical contact to the silicide layers 182 on the NSD layers 160 of the NMOS transistor 84, on the PSD layers 170 of the PMOS transistor 86, possibly on the head regions 112 of the resistor 82, and on the other component 80 if formed. The contacts 192 may be formed by defining contact areas on a top surface of the PMD layer 190 with a contact photoresist pattern, not shown, etching contact holes in the contact areas by removing PMD layer material using RIE etching methods to expose the silicide layers 182, and filling the contact holes with a contact liner metal, such as titanium, and a contact fill metal, typically CVD-tungsten, followed by removal of the contact fill metal from the top surface of the PMD layer 160 using etching and/or CMP methods.

An intrametal dielectric (IMD) layer 196 is formed over the PMD layer 190 and over the filled contacts 192. The IMD layer 196 may include one or more layers of silicon dioxide, a low-k material such as organo-silicate glass (OSG), carbon-doped silicon oxides (SiCO or CDO) or methylsilsesquioxane (MSQ), or an ultra low-k dielectric material such as a porous OSG (p-OSG) with a dielectric constant less than 2.5. In one version of the instant embodiment, the IMD layer 196 may be between 50 and 200 nanometers thick. The IMD layer 196 may be formed by any combination of chemical vapor deposition (CVD), PECVD, low pressure chemical vapor deposition (LPCVD), atmospheric pressure chemical vapor deposition (APCVD), HDP, HARP, or other suitable dielectric layer formation process.

First level metal interconnects 194 are formed in the IMD layer 196 so as to make electrical connection to the contacts 192. In one version of the instant embodiment, the first level metal interconnects 194 may be formed of copper in a tantalum nitride liner using a damascene process after the IMD layer 196 is formed. In another version, the first level metal interconnects 194 may be formed of aluminum using a deposition, pattern and etch process sequence prior to formation of the IMD layer 196. Other processes to form the first level metal interconnects 164 are within the scope of the instant embodiment.

Although an n-type pregate doping implant plus n-type NSD implants are used to illustrate an embodiment, other combinations of n-type doping implants such as n-type pregate doping implant plus various n-type NLDD implants may be used. In addition p-type pregate doping implants plus p-type PSD implants or various P-type PLDD implants may be used.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of operating a computer system to add a TCR resistor to a CMOS integrated circuit manufacturing flow comprising the steps of:
    retrieving said CMOS integrated circuit manufacturing flow;
    retrieving a TCR resistor program;
    inputting target resistance and TCR specification for said TCR resistor into said computer system;
    selecting a first implantation dose from said CMOS integrated circuit manufacturing flow to be implanted into a body of said TCR resistor;
    selecting at least a second implantation dose from said CMOS integrated circuit to be implanted into said body;
    adjusting said second implantation dose to generate an adjusted implant with an acceptable specification range dose;
    retrieving TCR vs. active doping data;
    retrieving TCR vs. carbon doping data;
    determining if a TCR of said TCR resistor meets said TCR specification with said first implantation dose and with said adjusted implant;
    using said TCR vs. carbon doping data to select a carbon dose to adjust said resistance of said TCR resistor to within said TCR specification; and
    adding said carbon dose to at least one of said first implantation dose and said adjusted implant;
    forming a TCR manufacturing flow for forming an integrated circuit with said TCR resistor using no additional masking steps where said body of said TCR resistor is implanted with said first implantation dose and with said adjusted implant; and
    storing said TCR manufacturing flow.

2. The method of claim 1 where said carbon dose is added to said adjusted implant.

3. The method of claim 2 where said carbon dose is in the range of about $5 \times 10^{14}$ atoms/cm$^2$ and $2 \times 10^{15}$ atoms/cm$^2$.

4. The method of claim 1 where said first implant is an NSD implant and where said adjusted implant is a pregate etch n-type doping implant.

5. The method of claim 1 where said TCR resistor is a n-type TCR polysilicon resistor with an n-type doping density in the range from about 6E20/cm$^3$ to about 1.3E21/cm$^3$.

6. The method of claim 4 where said TCR resistor is about 70 nm thick and where said NSD implant is about 2E15/cm$^2$ arsenic plus about 2E15/cm$^2$ phosphorus and where said adjusted implant is about 5E15/cm$^2$ phosphorus.

7. The method of claim 4 where said TCR resistor is about 70 nm thick and where said NSD implant is about 2E15/cm$^2$ arsenic plus about 2E15/cm$^2$ phosphorus and where said adjusted implant is about 5E15/cm$^2$ phosphorus plus about 2E15/cm$^2$ carbon.

8. The method of claim 1 where said TCR resistor is a p-type TCR resistor with a p-type doping density in the range from about 2E20/cm$^3$ to about 8E20/cm$^3$.

9. A method of creating a TCR manufacturing flow for fabricating an integrated circuit with a TCR resistor with no additional masking from a CMOS integrated circuit manufacturing flow steps, comprising the steps of:
    retrieving said CMOS integrated circuit manufacturing flow;
    retrieving a TCR resistor program;
    inputting target resistance and TCR specification for said TCR resistor into said computer system;
    selecting an NSD implant dose from said CMOS integrated circuit manufacturing flow to be implanted into a body of said TCR resistor;
    selecting a pre-gate etch n-type doping implant dose from said CMOS integrated circuit to be implanted into said body;
    adjusting said pre-gate etch n-type doping implant dose to generate an adjusted implant with an acceptable specification range dose;
    forming the TCR manufacturing flow for fabricating an integrated circuit with said TCR resistor where said body of said TCR resistor is implanted with said NSD implant dose and with said adjusted implant; and
    storing said TCR manufacturing flow.

* * * * *